US009063879B2

(12) United States Patent
Yang et al.

(10) Patent No.: US 9,063,879 B2
(45) Date of Patent: Jun. 23, 2015

(54) INSPECTION OF NON-VOLATILE MEMORY FOR DISTURB EFFECTS

(71) Applicant: SANDISK TECHNOLOGIES INC., Plano, TX (US)

(72) Inventors: Nian Niles Yang, Mountain View, CA (US); Chris Avila, Saratoga, CA (US); Steven Sprouse, San Jose, CA (US); Jianmin Huang, San Carlos, CA (US); Yichao Huang, San Jose, CA (US); Kulachet Tanpairoj, Santa Clara, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 217 days.

(21) Appl. No.: 13/757,774

(22) Filed: Feb. 2, 2013

(65) Prior Publication Data
US 2014/0173382 A1 Jun. 19, 2014

Related U.S. Application Data

(60) Provisional application No. 61/736,983, filed on Dec. 13, 2012.

(51) Int. Cl.
G06F 11/00 (2006.01)
G06F 11/10 (2006.01)

(52) U.S. Cl.
CPC .................................. G06F 11/1072 (2013.01)

(58) Field of Classification Search
CPC ... G06F 11/0793; G06F 11/076; G06F 11/20; G06F 11/1068; G06F 11/1072

USPC ............ 714/5, 6, 25, 42, 718, 723, 769, 704, 714/773
See application file for complete search history.

(56) References Cited

U.S. PATENT DOCUMENTS

| 6,442,708 | B1 * | 8/2002 | Dierauer et al. | 714/25 |
| 6,684,353 | B1 * | 1/2004 | Parker et al. | 714/718 |
| 7,613,043 | B2 | 11/2009 | Cornwell et al. | |
| 7,639,542 | B2 | 12/2009 | Cornwell et al. | |
| 8,219,861 | B2 * | 7/2012 | Hida et al. | 714/723 |
| 8,274,301 | B2 * | 9/2012 | Feng et al. | 324/750.03 |
| 8,850,290 | B2 * | 9/2014 | Guthridge | 714/769 |
| 2010/0070798 | A1 * | 3/2010 | Cornwell et al. | 714/5 |
| 2010/0070801 | A1 * | 3/2010 | Cornwell et al. | 714/6 |
| 2011/0066902 | A1 | 3/2011 | Sharon et al. | |
| 2011/0280084 | A1 | 11/2011 | Radke et al. | |
| 2013/0346805 | A1 * | 12/2013 | Sprouse et al. | 714/42 |

FOREIGN PATENT DOCUMENTS

| WO | 2009012204 A1 | 1/2009 |
| WO | 2011019602 A2 | 2/2011 |

* cited by examiner

Primary Examiner — David Ton
(74) Attorney, Agent, or Firm — Toler Law Group, PC

(57) ABSTRACT

A method performed in a data storage device including a non-volatile memory includes reading a representation of data, the representation corresponding to one or more selected states of storage elements of a group of storage elements of the non-volatile memory. The method includes, in response to a count of errors in the representation of the data exceeding a threshold, scheduling a remedial action to be performed on the group of storage elements.

23 Claims, 5 Drawing Sheets

INSPECTION OF NON-VOLATILE MEMORY FOR DISTURB EFFECTS

CROSS-REFERENCE TO RELATED APPLICATIONS

The present application claims priority to U.S. Provisional Application No. 61/736,983, filed Dec. 13, 2012, which application is hereby incorporated by reference in its entirety.

FIELD OF THE DISCLOSURE

The present disclosure is generally related to non-volatile memory.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Although increasing the number of bits per cell and reducing device feature dimensions may increase storage density of a memory device, a bit error rate of data stored at the memory device may also increase.

Error correction coding (ECC) is often used to correct errors that occur in data read from a memory device. Prior to storage, data may be encoded by an ECC encoder to generate redundant information (e.g. "parity bits") that may be stored with the data as an ECC codeword. As more parity bits are used, an error correction capacity of the ECC increases and a number of bits required to store the encoded data also increases.

Once memory cells in a data storage device have been programmed, data may be read from the memory cells by sensing the programmed state of each memory cell by comparing the cell threshold voltage to one or more reference voltages. However, the sensed programming states can sometimes vary from the written programmed states due to one or more factors, such as read disturb and program disturb conditions that may be caused by read or write access to nearby memory cells, such as memory cells at adjacent word lines of the memory device.

SUMMARY

An inspection mechanism to detect disturb effects to data stored in a non-volatile memory includes reading data corresponding to selected states of a group of storage elements in the non-volatile memory. The selected states may be selected to include one or more states that are more susceptible to disturb effects than non-selected states. The data read from the selected states may be decoded to determine a count of errors occurring in the data and a remedial action may be performed based on the count of errors.

DETAILED DESCRIPTION

Figure 1:
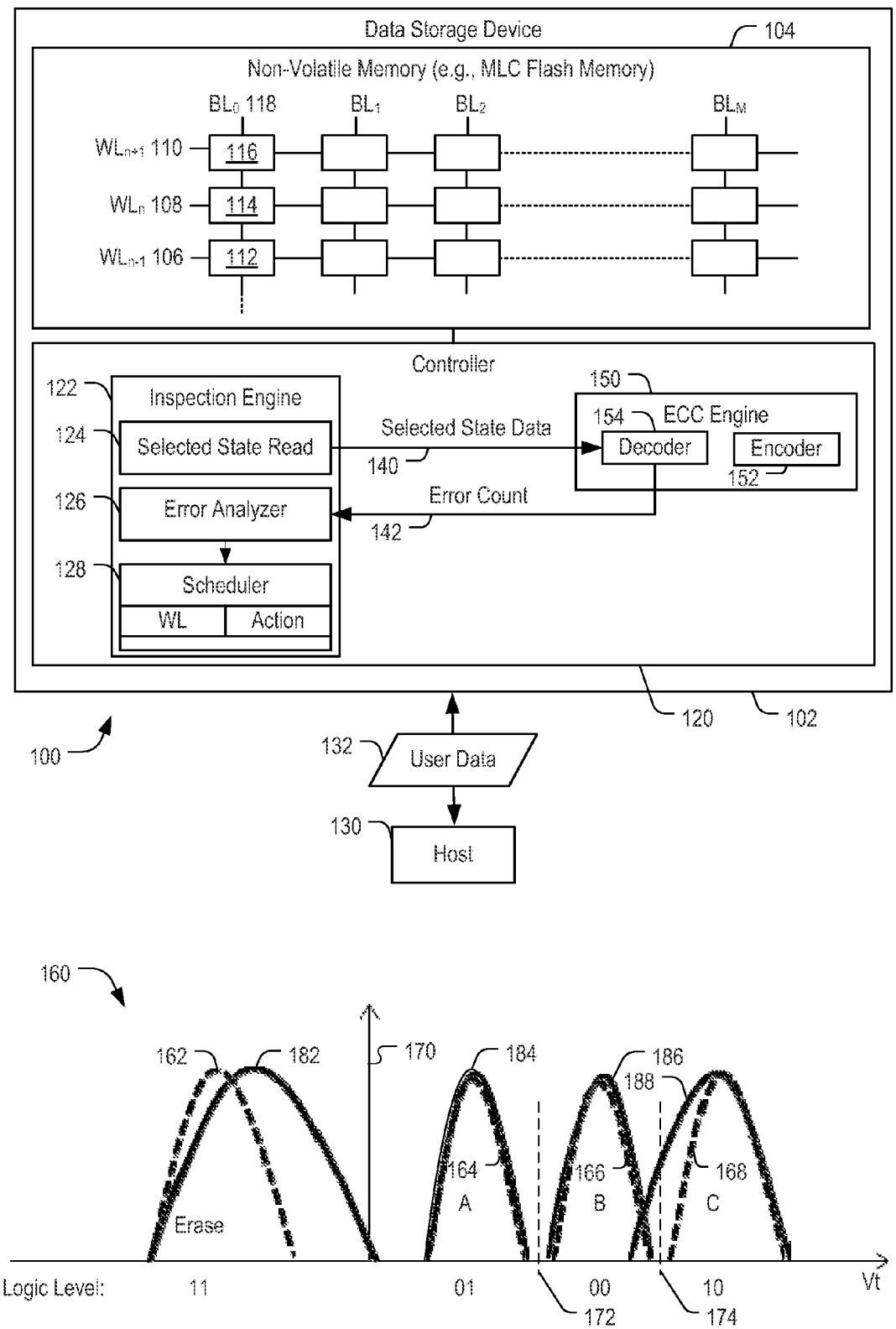
FIG. 1 is a block diagram of a particular illustrative embodiment of a system including a data storage device including an inspection engine configured to read selected states of a group of storage elements for inspection of disturb effects and illustrates an example of disturb effects that may occur to states of storage elements.

Referring to FIG. 1, a particular embodiment of a system 100 includes a data storage device 102 coupled to a host device 130. The data storage device 102 is configured to inspect groups of storage elements of a non-volatile memory 104 for disturb effects by reading selected states of the storage elements.

The host device 130 may be configured to provide data, such as user data 132, to be stored at the non-volatile memory 104 or to request data to be read from the non-volatile memory 104. For example, the host device 130 may include a mobile telephone, a music or video player, a gaming console, an electronic book reader, a personal digital assistant (PDA), a computer, such as a laptop computer, a notebook computer, or a tablet, any other electronic device, or any combination thereof.

The data storage device 102 includes the non-volatile memory 104 coupled to a controller 120. The non-volatile memory 104 may be a flash memory, such as a NAND flash memory. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The non-volatile memory 104 includes multiple storage elements, such as a first storage element 112, a second storage element 114, and a third storage element 116. For example, each storage element 112-116 may be a MLC flash cell. The storage elements are arranged to be accessible via one or more word lines, illustrated as a first word line 106, a second word line 108, and a third word line 110. In addition, the storage elements may be accessed via multiple bit lines, such as a bit line 118.

The controller 120 is configured to receive data and instructions from and to send data to the host device 130 while the data storage device 102 is operatively coupled to the host device 130. The controller 120 is further configured to send data and commands to the non-volatile memory 104 and to receive data from the non-volatile memory 104. For example, the controller 120 is configured to send data and a write command to instruct the non-volatile memory 104 to store the data to a specified address. As another example, the controller 120 is configured to send a read command to read data from a specified address of the non-volatile memory 104.

The controller 120 includes an ECC engine 150 that is configured to receive data to be stored to the non-volatile memory 104 and to generate a codeword. For example, the ECC engine 150 may include an encoder 152 configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode data according to one or more other ECC encoding schemes, or any combination thereof. The ECC engine 150 may include a decoder 154 configured to decode data read from the non-volatile memory 104 to detect and correct, up to an error correction capability of the ECC scheme, bit errors that may be present in the data.

The controller 120 includes an inspection engine 122. The inspection engine 122 is configured to initiate a selected state read operation 124 to read one or more selected states of storage elements in the non-volatile memory 104. The inspection engine 122 also includes an error analyzer 126 and a scheduler 128. The inspection engine 122 is configured to initiate a read of selected states of storage elements via the selected state read operation 124, such as to read selected states of storage elements of the second word line 108. Data read from the selected states of the storage elements may be provided as selected state data 140 to the decoder 154 of the ECC engine 150. The selected state data 140 may include one or more representations of ECC codewords that may have one or more bit errors caused by disturb effects to data while stored in the second word line 108.

The inspection engine 122 may receive an error count 142 from the decoder 154. For example, the error count 142 may include a count of errors that were detected and corrected in the selected state data 140. The error analyzer 126 may be configured to receive the error count 142 and to determine whether the group of storage elements under inspection is at risk of disturbances to stored data causing the stored data to be non-recoverable by the ECC engine 150. For example, the error analyzer 126 may compare the error count 142 to a threshold, and in response to the error count 142 matching or exceeding the threshold, the error analyzer 126 may cause a remedial action to be performed, such as by sending an indication of the word line under inspection to the scheduler 128.

The scheduler 128 may maintain a listing of word lines scheduled to have remedial action performed and may include an indication of one or more actions to be performed. For example, the scheduler 128 may schedule a particular word line for a data move operation when it is determined that a number of errors occurring in data read from selected states of the particular word line approaches a number of errors that may cause data stored in the word line to be non-recoverable by the ECC engine 150. In a particular implementation, the scheduler 128 may schedule a specific action based on the type of disturb detected as a result of the selected state read operation 124. For example, after reading selected states of a word line via the selected state read operation 124 and determining that a large number of errors in the error count 142 correspond to storage elements of the word line being disturbed from a lowest voltage state (e.g., an erase state), the word line may be scheduled for a refresh operation to restore data that has been disturbed due to read disturb effects. After a remedial action has been performed to a word line that is listed in the scheduler 128, such as by operation of the controller 120 during a background operation, an entry corresponding to the word line may be removed from the scheduler 128.

A cell voltage distribution (CVD) 160 illustrates a set of curves representing states of storage elements of a particular word line of the non-volatile memory 104, such as the second word line 108. Prior to disturb effects, the cell voltage distribution 160 may include a first curve 162 representing a distribution of threshold voltages of storage elements programmed to an erase (Er) state, a second curve 164 illustrating a distribution of threshold voltages of storage elements programmed to state A, a third curve 166 representing a distribution of threshold voltages of storage elements programmed to state B, and a fourth curve 168 illustrating a distribution of threshold voltages of storage elements programmed to state C.

Prior to disturb effects, data values stored in storage elements may be sensed by applying one or more read voltages, such as a first read voltage 170 between the erase state and state A, a second read voltage 172 between state A and state B, and a third read voltage 174 between state B and state C. For example, by applying the first read voltage 170 to each of the storage elements of a single word line, all storage elements of the word line having a threshold voltage less than the first read voltage 170 (i.e., all storage elements in the erase state), may be determined. As illustrated, each of the states may have a 2-bit value associated with the state. Storage elements in the erase state may correspond to a data value of 1 1, storage elements in state A may correspond to a data value of 0 1, storage elements in state B may correspond to a data value of 0 0, and storage elements in state C may correspond to a data value of 1 0.

After occurrence of one or more disturb effects, such as a read disturb or program disturb, or both, the curves 162-168 may shift, resulting in a first shifted curve 182 corresponding to storage elements originally in the erase state, a second shifted curve 184 corresponding to storage elements originally programmed to state A, a third shifted curve 186 corresponding to storage elements originally programmed to state B, and a fourth shifted curve 188 corresponding to storage elements originally programmed to state C.

As illustrated, the first shifted curve 182 has broadened as compared to the first curve 162. The first shifted curve 182 has a portion to the right of the first read voltage 170, representing storage elements having threshold voltages that have increased to have a threshold voltage value that is greater than the first read voltage 170. When storage elements are read using the first read voltage 170, storage elements of the first shifted curve 182 having threshold voltages to the right of the first read voltage 170 are incorrectly read as being in state A rather than in the erase state. As a result, the most significant bit (e.g., the upper bit) of data read from such storage elements may be incorrectly read as a 0 value instead of a 1 value.

Similarly, the fourth shifted curve 188 illustrates that storage elements originally programmed to state C may have threshold voltages that have lowered to a threshold voltage value that is less than the third read voltage 174. As a result, such storage elements are incorrectly identified as being in state B when read using the third read voltage 174. Data read from such storage elements may be incorrectly read as having a most significant bit value of 0 instead of the originally programmed bit value of 1.

As illustrated in the CVD 160, disturb effects may be more pronounced in states having a lowest voltage range (i.e., the erase state) and in states having a highest voltage range (i.e., state C). To efficiently determine whether or not storage elements of a particular word line are at risk due to disturb effects, the selected state read operation 124 performed by the inspection engine 122 may be performed to read states most likely to be affected by disturbs, such as the erase state and state C. As a result, when a word line under inspection is read according to the selected state read operation 124, the upper page (e.g., only the most significant bit of each state) may be read by applying the first read voltage 170 and the third read voltage 174 to read the erase state and state C of the storage elements of the word line, without using the second read voltage 172 to read state A and state B of the storage elements of the word line (i.e., the selected state read operation 124 may read the erase state and state C and may exclude state A and state B). As a result, reads of states for purposes of determining reliability of data may be performed with a reduced number of read operations as compared to reading all four states of each storage element of the word line under inspection.

During operation, the host device 130 may send a request to read the user data 132 from the non-volatile memory 104. In response, the controller 120 may send a read command to read the requested data from the second word line 108 of the non-volatile memory 104.

Issuing the read command may trigger the inspection engine 122 to initiate the selected state read operation 124 to perform an error analysis of selected states to determine whether the second word line 108 containing the requested data is at risk due to disturb effects. The selected state read operation 124 may therefore be performed in conjunction with a read operation or a write operation triggered by a request from the host 130.

The read command to access the second word line 108 may trigger the inspection engine 122 to select one or more neighboring word lines for inspection. For example, when the host device 130 requests to read data from the second word line 108, the inspection engine 122 may additionally request a selected state read operation 124 of the first word line 106 and/or of the third word line 110. Because the selected state read operation 124 may be performed more quickly than a full word line data read operation, inspection of one or more neighboring word lines of a target word line of a host read request may be performed efficiently and with relative small additional latency as compared to reading requested data from the target word line.

As another example, the inspection engine 122 may be configured to schedule and process multiple reads of word lines of the non-volatile memory 104 according to a background inspection process that is independent of accesses to the non-volatile memory 104 based on host requests. For example, the inspection engine 122 may periodically scan one or more portions of the non-volatile memory 104 to determine whether word lines accessed using the selected state read operation 124 are at risk of having non-recoverable errors due to disturb effects by comparing resulting error counts 142 to one or more error threshold conditions. Upon determining one or more word lines that may be at risk of non-recoverable data loss as a result of disturb effects, the inspection engine 122 may populate the scheduler 128 with identification of the one or more word lines and may designate one or more remedial actions to be performed.

By reading selected states of the storage elements, the inspection engine 112 can detect if the storage elements have been subjected to either a threshold voltage increase (for the lowest-voltage state) or threshold voltage decrease (for the highest-voltage state). Using results from the ECC engine 150, the inspection engine 112 can determine if errors caused by such threshold voltage shifts are correctable. The controller 120 can read data from storage elements of the non-volatile memory 104 to detect if the storage elements have shifted states by performing the selected state read operation 124 that is issued by the inspection engine 122, and the resulting selected data 140 may be processed by the ECC engine 150 to determine if the storage elements are at high risk for un-recoverable errors.

Since the inspection engine 122 may cause the selected state read operation 124 to read the selected states of the storage elements, inspection of storage elements may be fast and efficient. Inspection of storage elements can be performed in between system commands to the non-volatile memory 104 (e.g., between read/write operations triggered by requests from the host device 130), enabling on-the-fly memory inspection and scheduling of corrective actions. As a result, a reliability of stored data may be improved due to fewer bit errors occurring during storage in the non-volatile memory 104. Improved reliability may enable operation using a less-powerful ECC engine 150, resulting in reduced power consumption, reduced device size, reduced manufacturing cost, or a combination thereof. Alternatively, or in addition, improved reliability may enable longer operational life of the non-volatile memory 104.

Figure 2:
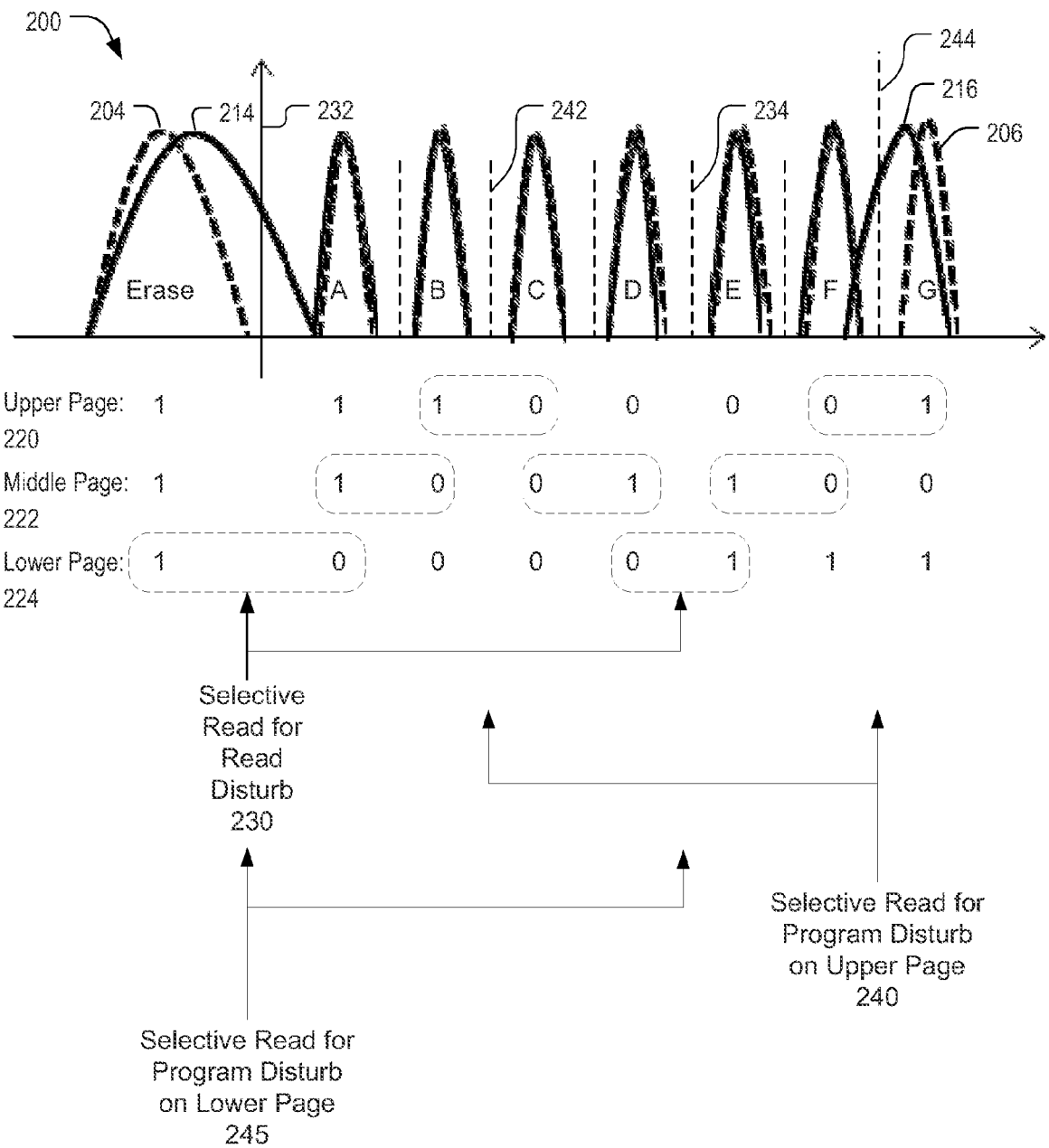
FIG. 2 is a general diagram illustrating selective read operations that may be performed by the data storage device of FIG. 1.

Referring to FIG. 2, a charge voltage distribution (CVD) 200 is illustrated for a 3-bit per cell (BPC) implementation of the non-volatile memory 104 of FIG. 1. The CVD 200 illustrates eight states, including an erase (Er) state and states A-G. A first curve 204 illustrates a distribution of threshold voltages of storage elements originally in the erase state, and a second curve 214 illustrates a distribution of the threshold voltages of the storage elements of the first curve 204 after occurrence of disturb effects. A third curve 206 illustrates a distribution of threshold voltages of storage elements originally programmed to state G (i.e., a highest voltage state), and a fourth curve 216 illustrates a distribution of threshold voltages of the storage elements of the third curve 206 after the occurrence of disturb effects.

A mapping of bits to states is also illustrated, showing that the erase state has a 3-bit value of 1 1 1, corresponding to a bit value of 1 in an upper page 220, a bit value of 1 in a middle page 222, and a bit value of 1 in a lower page 224. Similarly, storage elements programmed to state A correspond to a 3-bit value of 1 1 0, having a bit value of 1 in the upper page 220, a bit value of 1 in the middle page 222, and a bit value of 0 in the lower page 224. The upper page 220 may store a first ECC codeword, the middle page 222 may store a second ECC codeword, and the lower page 224 may store a third ECC codeword. By storing independently decodable ECC codewords in each of the logical pages 220-224, a single decodable codeword may retrieved from a physical page at the MLC word line by reading a single page 220, 222, or 224, without reading data corresponding to all three pages 220-224.

For example, the lower page 224 may be read by performing a first sensing operation using a first read voltage 232, corresponding to a boundary between the erase state and state A, and performing a second sense operation using a second read voltage 234, corresponding to a boundary between state D and state E. Storage elements that are activated when sensed using the first read voltage 232 are read as storing a 1-bit in the lower page 224, and storage elements that are activated when sensed using the second read voltage 234 but not activated when sensed using the first read voltage 232 are read as storing a 0 value in the lower page 224. Storage elements that are not activated when sensed using the second read voltage 234 are read as storing a 1 value in the lower page 224. Thus, the lower page 224 may be read by sensing storage elements using only two read voltages 232, 234. Similarly, the upper page 220 may be read by performing a first sense operation at a third read voltage 242 between state B and state C and a third sense operation at a fourth read voltage 244 between state F and state G.

Because disturb effects may be predicted to occur in the lowest voltage state (i.e., the erase state) and in the highest voltage state (i.e., state G) the inspection engine 122 may perform the selected state read operation 124 to identify data stored in only the lowest state and the highest state for efficiency when determining a risk of data loss due to disturb effects in a word line. For example, to detect read disturb effects that typically increase a threshold voltage of cells stored to the erase state, the selected state read operation 124 may correspond to a selective state read for read disturb effects 230 to read data stored in the lower page 224. That is, the selected state read operation 124 may include a sensing of cells using the first read voltage 232 and the second read voltage 234. Data read from the lower page 224 may be a representation of an ECC codeword that may include one or more data errors. The representation of the ECC codeword may be provided as the selected state data 140 to the ECC engine 150. The ECC decoder 154 may perform an ECC decode operation on the representation of the ECC codeword read from the lower page 224 and may determine a count of errors occurring in the data.

Because errors occurring in the erase state due to a transition between the erase state and state A (Er-A) are more likely than data errors occurring due to a transition between state D and state E (D-E), an error count associated with decoding the ECC codeword of the lower page 224 may be assumed to be due to read disturb effects to the erase state when analyzed by the error analyzer 126 of FIG. 1 for determination of whether remedial action is to be taken. However, in other implementations Er-A errors occurring due to voltage shifting across the first read voltage 232 may be distinguished from D-E errors occurring due to voltage shifting across the second read voltage 234 by reading additional data from the word line. For example, in a technique known as "error splitting", data corresponding to the upper page 220 may be read to determine whether a particular storage element experiencing a bit error in the lower page 224 is programmed to the erase state or state A, or is programmed to state D or state E. For example, when a storage element is programmed to the erase state or state A, the upper page 220 has a 1 value, while if the storage element is programmed to state D or state E, the upper page 220 has a 0 value.

As an alternative (or in addition) to performing the selective state read for read disturb effects 230, the selected state read operation 124 may include a selective state read for program disturb effects on upper page 240. Because program disturb effects may occur to the highest voltage state, the selective state read for program disturb on upper page 240 may be performed by reading the upper page 220. The upper page 220 can be read by performing a first sensing operation using the third read voltage 242 and performing a second sensing operation using the fourth read voltage 244. The resulting data read from the upper page 220 according to the selective state read for program disturb 240 may be provided to the ECC decoder 154 of FIG. 1 for error detection and correction, and the corresponding count of errors may be attributed to errors occurring at the F-G state boundary. Alternatively, a determination may be made as to which errors occur at the B-C boundary and which errors occur at the F-G boundary according to an error splitting technique.

Because program disturb effects may occur to the lowest voltage state, a selective state read for program disturb on lower page 245 may be performed by reading the lower page 224. The lower page 224 can be read by performing a first sensing operation using the first read voltage 232 and performing a second sensing operation using the fifth read voltage 234. The resulting data read from the lower page 224 according to the selective state read for program disturb on lower page 245 may be provided to the ECC decoder 154 of FIG. 1 for error detection and correction, and the corresponding count of errors may be attributed to errors occurring at the Er-A state boundary. Alternatively, a determination may be made as to which errors occur at the Er-A boundary and which errors occur at the D-E boundary according to an error splitting technique.

Program disturb effects occurring at the upper page 220 and at the lower page 224 may be determined by performing the selective state read for program disturb for upper page 240 and the selective state read for program disturb for lower page 245 to read the upper page 220 and the lower page 224, without reading the middle page 222. As a result, errors resulting from program disturb effects may be detected more efficiently than by reading all three pages 220-224.

Figure 3:
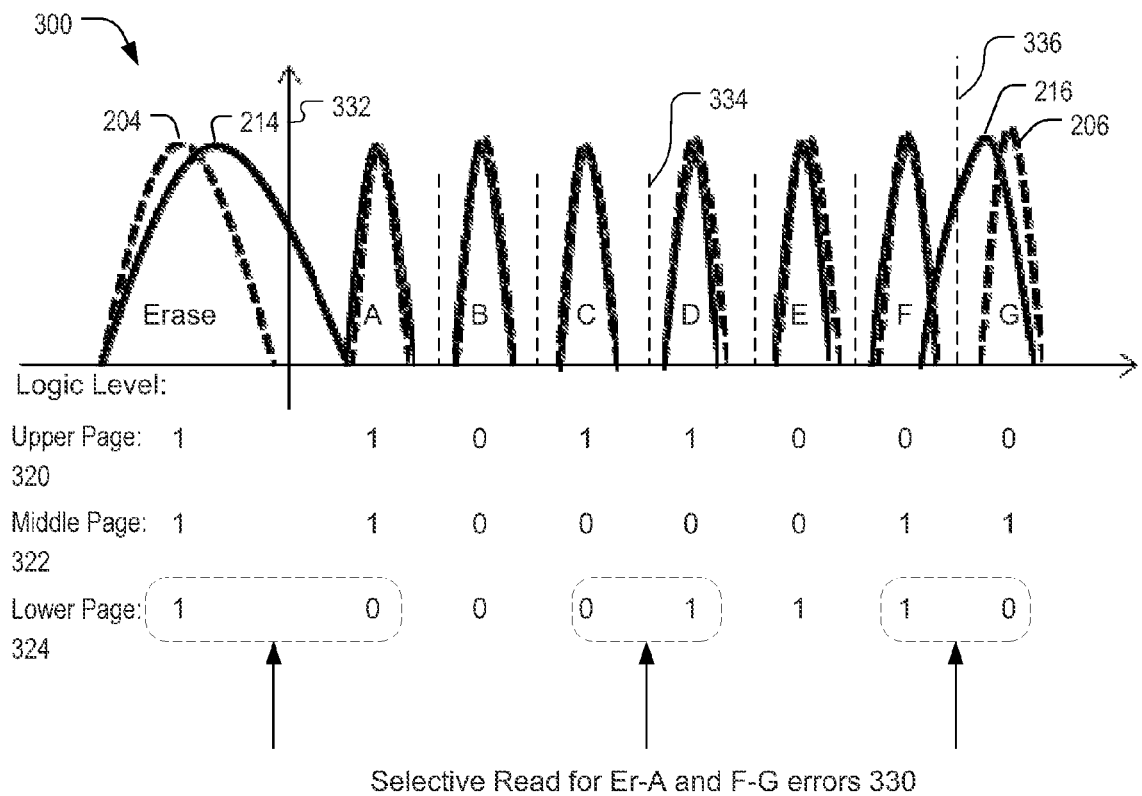
FIG. 3 is a general diagram illustrating other selective read operations that may be performed by the data storage device of FIG. 1.

FIG. 3 illustrates a CVD 300 corresponding to the CVD 200 of FIG. 2, having the first curve 204 and the second curve 214 corresponding to a threshold voltage distribution of storage elements in the erase state prior to and after disturb effects respectively, and having the third curve 206 and the fourth curve 216 corresponding to threshold voltage distributions of storage elements originally programmed to state G prior to and after disturb effects, respectively. FIG. 3 illustrates a different mapping of bits to states than FIG. 2 that may enable even more efficient disturb detection. An upper page 320 can be read using read voltages at the A-B, B-C, and D-E state boundaries. A middle page 322 can be read using read voltages at the A-B and E-F state boundaries. A lower page 324 can be read using a first read voltage 332 at the Er-A state boundary, a second read voltage 334 at the C-D state boundary, and a third read voltage 336 at the F-G state boundary.

Because data errors due to threshold voltage shifting across the Er-A and the F-G state boundaries occur in the lower page 324, the selected state read operation 124 of FIG. 1 may include a selective read for Er-A and F-G errors 330 that reads the lower page 324. The selective read for Er-A and F-G errors 330 can be used for read disturbs and for program disturbs occurring at the lowest voltage state (Erase state) and the highest voltage state (state G). To illustrate, the selective read for Er-A and F-G errors 330 can include performing a first sense operation using the first read voltage 332, a second sense operation using the second read voltage 334, and a third sense operation using the third read voltage 336.

The data from the lower page 324 may be provided to the ECC engine 150 to determine a total number of errors and bit locations of the errors that are corrected by the ECC decoder 154. The total number of errors may be analyzed by the error analyzer 126 to determine a remedial action, such as a data move operation. In another implementation, the error count 142 may be apportioned between errors due to disturbs of storage elements from the erase state to state A and errors due to disturbs of storage elements from state G to state F, resulting in a more accurate determination of a cause of disturb errors and an appropriate remedial action to be taken by the inspection engine 122.

Figure 4:
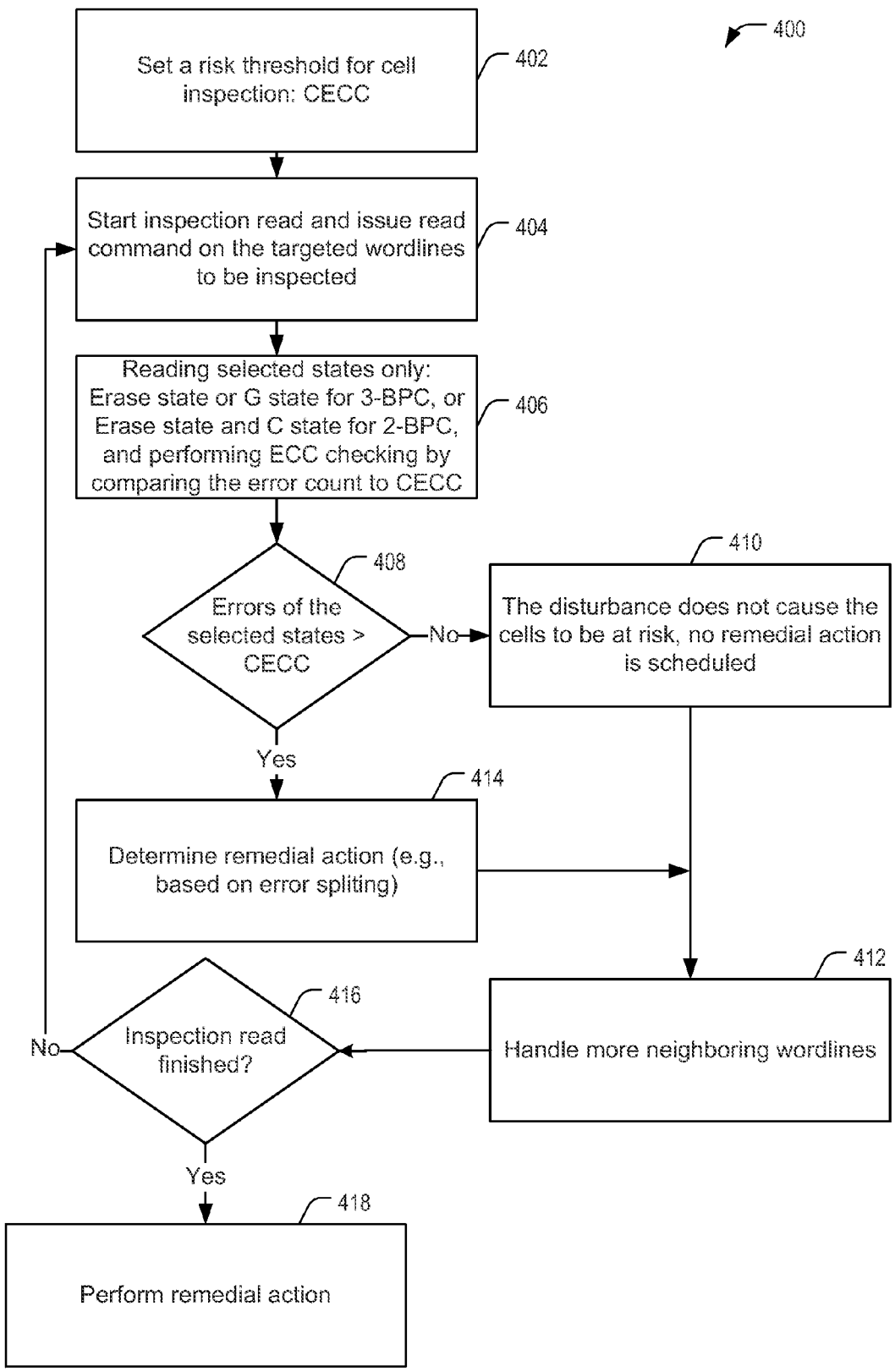
FIG. 4 is a flow chart of a particular embodiment of a method of inspecting a non-volatile memory for disturb effects.

Referring to FIG. 4, a particular embodiment of a method 400 is depicted. The method 400 may be performed in a data storage device, such as the data storage device 102 of FIG. 1.

The method 400 includes setting a risk threshold (CECC) for cell inspection, at 402. For example, the CECC may correspond to a number of errors that indicate a risk of accumulated errors in read data exceeding an error correction capability of an ECC scheme used to encode the data.

An inspection read operation is initiated, at 404. The inspection read operation includes issuing a read command on one or more targeted word lines to be inspected.

An inspection read operation is performed to read selected states of a targeted word line, at 406. The inspection read operation may read selected states of storage elements of the targeted word line. The inspection read operation may correspond to the selected state read operation 124 of FIG. 1. For example, in a 2-BPC implementation, the inspection read operation may read the erase state and state C, as illustrated in FIG. 1, without reading state A and state B. In a 3-BPC implementation, the inspection read operation may read the erase state and state G (and possibly one or more other states), such as described with respect to FIGS. 2-3. Data read from the selected states may be decoded by an ECC engine, such as the ECC engine 150 of FIG. 1, and a count of errors in the data may be compared to the risk threshold (CECC).

If the count of errors of the selected states is determined to be less than or equal to the risk threshold CECC, at 408, a determination is made that disturbances to states of storage elements in the targeted word line do not cause the storage elements to be at risk for non-recoverable data errors, at 410. No remedial action is performed to the target word line, and processing continues with handling of one or more neighboring word lines to the targeted word line, at 412.

If the count of errors is determined to be greater than the risk threshold CECC, at 408, a remedial action to be performed is determined, at 414. For example, an error splitting technique may be use to identify errors as occurring due to storage elements shifting out of an erase state due to threshold voltage increases or as occurring due to storage elements shifting out of a highest voltage state (e.g., state C in a 2-BPC implementation or state G in a 3-BPC implementation) due to threshold voltage decreases. The remedial action to be performed may be determined by the error analyzer 126 and may be entered into the scheduler 128 such as described with respect to FIG. 1. Processing may continue with handling one or more neighboring word lines to the targeted word line, at 412.

A determination may be made wither the inspection read operation has completed, at 416. If the inspection read operation has completed (e.g., all targeted word lines have been inspected), one or more of the determined remedial actions may be performed, at 418. For example, a flash management engine in the controller 120 of FIG. 1 may access entries in the scheduler 128 during a background or housekeeping operation and may perform a remedial action (e.g., a data move or a data refresh operation) for each word line indicated in the scheduler 128. Otherwise, processing may return to issue read commands to additional targeted word lines to be inspected, at 404.

Figure 5:
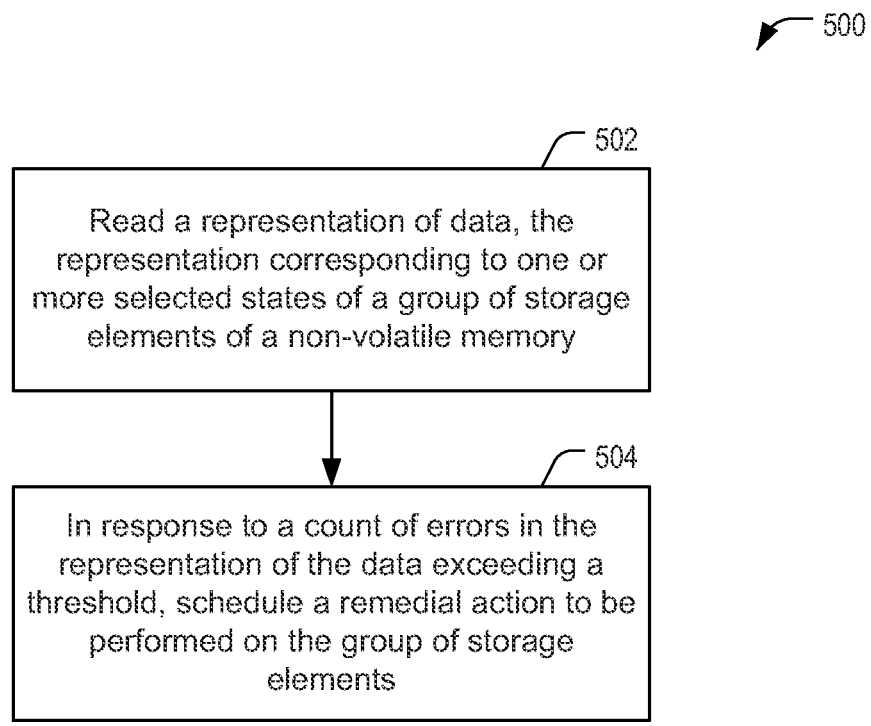
FIG. 5 is a flow chart of another particular embodiment of a method of inspecting a non-volatile memory for disturb effects.

Another particular embodiment of a method of inspecting storage elements by reading selected states is illustrated in FIG. 5. The method 500 may be performed in a data storage device, such as the data storage device 102 of FIG. 1, that includes a non-volatile memory such as a flash memory.

The method 500 includes reading a representation of data, the representation corresponding to one or more selected states of a group of storage elements of the non-volatile memory, at 502. For example, each storage element of the group of storage elements is programmable to have a threshold voltage corresponding to a particular state of a set of states, and at least one state of the set of states is excluded from the one or more selected states. To illustrate, the selected state read operation 124 of FIG. 1 may read states Er and C illustrated in the CVD 160 and may exclude states A and B. As another example, the selected state read for read disturb effects 230 of FIG. 2 reads state Er and performs a sense operation at the D-E state boundary without distinguishing between states A-D or states E-G, and the selected state read for program disturb effects 240 reads state G and performs a sense operation at the B-C boundary without distinguishing between states Er-B or states C-F. As another example, the selective read for Er-A and F-G errors 330 of FIG. 3 reads state Er and state G and performs a sense operation at the C-D boundary without distinguishing between states A-C or states D-F. The representation of data may correspond to the selected state data 140 of FIG. 1 that is generated in response to the selected state read operation 124.

In response to a count of errors in the representation of the data exceeding a threshold, a remedial action is scheduled to be performed on the group of storage elements, at 504. For example, the representation of the data may correspond to an error correction coding (ECC) codeword, and the count of errors may correspond to an output of an ECC decoder of the data storage device, such as the ECC decoder 154 of FIG. 1. The threshold may be less than an error correction capability of an ECC decoder. For example, when data has been encoded according to a particular ECC scheme, the error correction capability of the ECC decoder 154 of FIG. 1 when decoding a representation of the data corresponds to an error correction capability of the particular ECC scheme. The threshold may be set to a value indicating a risk of data becoming unrecoverable prior to accumulated errors in the data exceeding an error correction capability of the ECC decoder 154 of FIG. 1.

The one or more selected states may include a lowest voltage state of the set of states, and the count of errors exceeding the threshold may indicate a read disturb condition. Alternatively, or in addition, the one or more states may include a highest voltage state of the set of states, and the count of errors exceeding the threshold may indicate a program disturb condition. To illustrate, the one or more selected states may include the erase state and state C of FIG. 1 and may exclude state A and state B. As other examples, reading the representation of data corresponding to the one or more selected states may correspond to the selective read for read disturb errors 230 and/or the selective read for program disturb errors 240 of FIG. 2 or the selective read for Er-A and F-G errors 330 of FIG. 3.

The method 500 may be performed in conjunction with a memory access operation initiated by a host device, such as the host device 130 of FIG. 1. For example, a data read operation, such as initiated by a host device, may be performed to access a first word line of the non-volatile memory. The group of storage elements may correspond to a second word line of the non-volatile memory that neighbors the first word line. Reading the representation of the data from the second word line may be initiated in response to the data read operation (e.g., in response to a host read request). Alternatively, reading the representation of the data from the group of storage elements may be performed as part of a background process to inspect disturb effects in the non-volatile memory.

Although various components depicted herein are illustrated as block components and described in general terms, such components may include one or more microprocessors, state machines, or other circuits configured to enable the inspection engine 112 of FIG. 1 to initiate the selected state read operation 124, analyze error results returned from the ECC engine 150, and selectively schedule a remedial action to be performed if the error results indicate that the inspected storage elements are at risk for non-recoverable errors. For example, the inspection engine 112 may represent physical components, such as hardware controllers, state machines, logic circuits, or other structures, to enable the inspection engine 112 of FIG. 1 to initiate the selected state read operation 124, analyze error results returned from the ECC engine 150, and selectively schedule a remedial action to be performed if the error results indicate that the inspected storage elements are at risk for non-recoverable errors.

The inspection engine 112 may be implemented using a microprocessor or microcontroller programmed to initiate the selected state read operation 124, analyze error results returned from the ECC engine 150, and selectively schedule a remedial action to be performed if the error results indicate that the inspected storage elements are at risk for non-recoverable errors. In a particular embodiment, the inspection engine 112 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a non-volatile memory, performing:
   reading a representation of data, the representation corresponding to one or more selected states of storage elements of a group of storage elements of the non-volatile memory, wherein each storage element of the group of storage elements is programmable to have a threshold voltage corresponding to a particular state of a set of states, and wherein at least one state of the set of states is excluded from the one or more selected states; and
   in response to a count of errors in the representation of the data exceeding a threshold, scheduling a remedial action to be performed on the group of storage elements.

2. The method of claim 1, wherein the one or more selected states includes a lowest voltage state of the set of states.

3. The method of claim 2, wherein the count of errors exceeding the threshold indicates a read disturb condition.

4. The method of claim 1, wherein the one or more selected states includes a highest voltage state of the set of states.

5. The method of claim 4, wherein the count of errors exceeding the threshold indicates a program disturb condition.

6. The method of claim 1, wherein reading the representation of the data from the group of storage elements is performed as part of a background process to inspect disturb effects in the non-volatile memory.

7. The method of claim 1, wherein the non-volatile memory is a flash memory.

8. The method of claim 1, further comprising performing a data read operation to access a first word line of the non-volatile memory, wherein the group of storage elements corresponds to a second word line of the non-volatile memory that neighbors the first word line, and wherein reading the representation of the data from the second word line is initiated in response to the data read operation.

9. A method comprising:
   in a data storage device including a non-volatile memory, performing:
   executing a data read operation to access a first word line of the non-volatile memory;
   reading a representation of data, the representation corresponding to one or more selected states of storage elements of a group of storage elements of the non-volatile memory, wherein the group of storage elements corresponds to a second word line of the non-volatile memory that neighbors the first word line, and wherein reading the representation of the data from the second word line is initiated in response to the data read operation; and
   in response to a count of errors in the representation of the data exceeding a threshold, scheduling a remedial action to be performed on the group of storage elements.

10. The method of claim 9, wherein the representation of the data corresponds to an error correction coding (ECC) codeword, wherein the count of errors corresponds to an output of an ECC decoder of the data storage device, and wherein the threshold is less than an error correction capability of the ECC decoder.

11. The method of claim 9, wherein the group of storage elements corresponds to a multi-level cell (MLC) word line configured to store multiple logical pages of data and wherein reading the representation of the data includes reading a first logical page of the multiple logical pages without reading a second logical page of the multiple logical pages.

12. A data storage device comprising:
    a non-volatile memory; and
    a controller configured to read a representation of data, the representation corresponding to one or more selected states of storage elements of a group of storage elements of the non-volatile memory, wherein each storage element of the group of storage elements is programmable to have a threshold voltage corresponding to a particular state of a set of states, and wherein at least one state of the set of states is excluded from the one or more selected states, the controller further configured, in response to a count of errors in the representation of the data exceeding a threshold, to schedule a remedial action to be performed on the group of storage elements.

13. The data storage device of claim 12, wherein the one or more selected states includes a lowest voltage state of the set of states.

14. The data storage device of claim 13, wherein the count of errors exceeding the threshold indicates a read disturb condition.

15. The data storage device of claim 12, wherein the one or more selected states includes a highest voltage state of the set of states.

16. The data storage device of claim 15, wherein the count of errors exceeding the threshold indicates a program disturb condition.

17. The data storage device of claim 12, wherein the controller is configured to read the representation of the data from the group of storage elements as part of a background process to inspect disturb effects in the non-volatile memory.

18. The data storage device of claim 12, further comprising an error correction coding (ECC) decoder, wherein the representation of the data corresponds to an ECC codeword, wherein the count of errors corresponds to an output of an ECC decoder of the data storage device, and wherein the threshold is less than an error correction capability of the ECC decoder.

19. The data storage device of claim 12, wherein the group of storage elements corresponds to a multi-level cell (MLC) word line configured to store multiple logical pages of data and wherein the controller is configured to read the representation of the data by reading a first logical page of the multiple logical pages without reading a second logical page of the multiple logical pages.

20. The data storage device of claim 12, wherein the non-volatile memory is a flash memory.

21. A data storage device comprising:
a non-volatile memory; and
a controller is configured to perform a data read operation to access a first word line of the non-volatile memory and to initiate a second data read operation of a representation of data from a second word line in response to the data read operation, the controller further configured to read the representation of the data, the representation corresponding to one or more selected states of storage elements of a group of storage elements of the non-volatile memory, wherein the group of storage elements corresponds to the second word line of the non-volatile memory that neighbors the first word line, the controller configured, in response to a count of errors in the representation of the data exceeding a threshold, to schedule a remedial action to be performed on the group of storage elements.

22. The data storage device of claim 21, wherein each storage element of the group of storage elements is programmable to have a threshold voltage corresponding to a particular state of a set of states, and wherein at least one state of the set of states is excluded from the one or more selected states.

23. The data storage device of claim 21, wherein the non-volatile memory comprises a flash memory.

* * * * *

UNITED STATES PATENT AND TRADEMARK OFFICE
CERTIFICATE OF CORRECTION

PATENT NO. : 9,063,879 B2
APPLICATION NO. : 13/757774
DATED : June 23, 2015
INVENTOR(S) : Nian Niles Yang et al.

It is certified that error appears in the above-identified patent and that said Letters Patent is hereby corrected as shown below:

In the Claims,

Claim 21 (Column 14, Line 5) "a controller is configured to perform a data read operation" should be --a controller configured to perform a data read operation--.

Signed and Sealed this
Twenty-sixth Day of April, 2016

Michelle K. Lee
*Director of the United States Patent and Trademark Office*